US012192658B2

(12) United States Patent
Black et al.

(10) Patent No.: US 12,192,658 B2
(45) Date of Patent: Jan. 7, 2025

(54) INTERFACE CIRCUIT FOR PHOTODETECTORS PROVIDING FULL-FRAME INTEGRATION AND PIXEL-LEVEL DIGITIZATION

(71) Applicant: Nu-Trek, Inc., San Diego, CA (US)

(72) Inventors: Stephen Holden Black, Tennessee Ridge, TN (US); Paul Richard Behmen, Chester, CA (US); Francisco Tejada, Kingsville, MD (US)

(73) Assignee: NU-Trek, Inc., San Diego, CA (US)

( * ) Notice: Subject to any disclaimer, the term of this patent is extended or adjusted under 35 U.S.C. 154(b) by 211 days.

(21) Appl. No.: 18/111,233

(22) Filed: Feb. 17, 2023

(65) Prior Publication Data

US 2024/0053204 A1    Feb. 15, 2024

Related U.S. Application Data

(60) Provisional application No. 63/312,702, filed on Feb. 22, 2022, provisional application No. 63/312,687, filed on Feb. 22, 2022.

(51) Int. Cl.
| | |
|---|---|
| *G01J 5/20* | (2006.01) |
| *G01J 1/44* | (2006.01) |
| *G01R 19/00* | (2006.01) |
| *H04N 25/77* | (2023.01) |
| *H04N 25/78* | (2023.01) |

(52) U.S. Cl.
CPC ............. *H04N 25/77* (2023.01); *G01J 1/44* (2013.01); *G01J 5/20* (2013.01); *G01R 19/0038* (2013.01); *H04N 25/78* (2023.01); *G01J 2005/202* (2013.01)

(58) Field of Classification Search
CPC ........ H04N 25/77; H04N 23/10; H04N 23/11; H04N 25/00; H04N 25/40; H04N 25/41; H04N 25/44; H04N 25/46; H04N 25/47; H04N 23/00; H04N 25/75; H04N 25/772; G06F 1/00; G06F 3/002; G06F 3/007; G06F 3/0202; G06F 2115/00; G06F 2115/02; G06F 2115/04; G06F 2117/00; G06F 3/00; G06F 7/00; G06F 7/02; G06F 7/026; G01J 1/44; G01J 2001/4406; G01J 2001/446; G01J 1/46; G01J 5/34; G01J 5/35; G01J 5/52
See application file for complete search history.

(56) References Cited

U.S. PATENT DOCUMENTS

2010/0226495 A1* 9/2010 Kelly ................. G11B 20/0021
380/28

* cited by examiner

*Primary Examiner* — Don K Wong
(74) *Attorney, Agent, or Firm* — Mark Rodgers

(57) ABSTRACT

A photodetector interface circuit is described, residing partially or fully within a unit cell per pixel of an FPA. The interface circuit uses an innovative approach to providing pixel level digitization for full frame integration times while maintaining the ability to use integration capacitors of practical sizes. The technique uses successive charge subtraction, removing charge from an integration capacitor successively, triggered by the charge increasing sufficiently to charge the integrator to a reference level, thereby triggering both charge removal and incrementing a count, until all of the current flowing in the photodetector has been accounted for and the count represents the digitization of the photodetector signal. Various options on how to arrange the digitization elements are also disclosed.

19 Claims, 9 Drawing Sheets

INTERFACE CIRCUIT FOR PHOTODETECTORS PROVIDING FULL-FRAME INTEGRATION AND PIXEL-LEVEL DIGITIZATION

BACKGROUND

The specification relates to interface circuits for photodetector arrays, and in particular to microbolometer or photoconductive detector based image sensors with full frame integration and pixel level digitization.

Imaging sensors, which often take the form of Focal Plane Arrays (FPA's), may include microfabricated arrays of photodetectors mated with, or fabricated on, microfabricated Read-Out Integrated Circuits (ROIC's). These hybrid "chips" benefit from improvements in microfabrication technologies, particularly to the advances in density of circuitry, in turn allowing for new approaches to FPA design. Such improvements are particularly interesting for imagers operating in the infrared spectral regions as such imagers generally face more design challenges than visible spectrum imagers. New FPA configurations provide opportunities for expanding the use and application of longer wave imaging technologies, but also present new problems to be addressed.

SUMMARY

Example embodiments described herein have innovative features, no single one of which is indispensable or solely responsible for their desirable attributes. Without limiting the scope of the claims, some of the advantageous features will now be summarized.

In some embodiments, a photodetector interface circuit may be provided, residing partially or fully within a unit cell per pixel of an FPA. The interface circuit uses an innovative approach to providing pixel level digitization for full frame integration times while maintaining the ability to use integration capacitors of practical sizes. The technique uses successive charge subtraction, removing packets of charge from an integration capacitor successively, triggered by the charge increasing sufficiently to cause the integrators output to exceed a reference level, thereby triggering both charge removal and incrementing a counter, until all of the current flowing in the photodetector has been accounted for and the count represents the digitization of the photodetector signal. Various options on how to arrange the digitization elements are also disclosed.

In a particular aspect, an interface circuit may be provided for a photodetector providing digitization of the current flowing in the detector, including; a bias circuit connected to one terminal of the photodetector; a transimpedance amplifier having a capacitive feedback element as an integrator of the detector current, the feedback element connected between the amplifier output and a node connected to sink or source current from the photodetector and the negative input of the amplifier, where the feedback element is periodically reset; a voltage comparator comparing the output of the transimpedance amplifier with a predetermined reference voltage; a charge subtraction circuit which removes a quantity of charge from the transimpedance amplifier's feedback element when triggered by the voltage comparator; and, a digital counter configured to count the number of charge subtraction events over a frame period.

In one embodiment, the photodetector may be a bolometer. In another embodiment, the photodetector may be a photoconductor In one embodiment, the photodetector may be part of an imaging array, each photodetector pixel in the array associated with a unit cell of a Read Out Integrated Circuit integrated with the array of photodetectors, and at least one or more elements of the interface circuit are part of a unit cell per pixel, and wherein the array of photodetectors and the ROIC are microfabricated using at least one CMOS silicon wafer. In another embodiment, all of the interface circuit elements may be fabricated within each unit cell.

In one embodiment, the counter may be located outside the unit cell. In another embodiment, the counter may be fabricated on at least one second CMOS wafer, and integrated with the array and ROIC using 3-dimensional circuit integration techniques. In one embodiment, the counter may be fabricated utilizing carbon nanotube CMOS logic and is integrated above the ROIC's active circuitry. In another embodiment, the interface circuit may further include a reference voltage applied to the positive terminal of the transimpedance integration amplifier.

In one embodiment, he interface circuit may further include a clamp capacitor connected between the node connected to one of the sink or source current from the photodetector and the amplifier's negative input. In another embodiment, the interface circuit may further include a switch connecting the node to sink or source current from the photodetector to an independent voltage source, the switch activated while the feedback element is in reset, and the voltage on the node connected to sink or source current from the photodetector may be set to a level independent of the amplifier's reset voltage.

In one embodiment, the charge subtraction may be performed via a clocked capacitor, configured to subtract an amount of charge on the integration capacitor sufficient to return the integrator's output closer to it's reset level. In another embodiment, the charge subtractions may occur until the total amount of charge subtracted corresponds roughly to the current flowing in the photodetector times the frame period, and the total count of comparator triggers may be the digitization of the photodetector current. In one embodiment, the bias circuit may include a differential arrangement with at least one blind reference detector whereby the current flowing in the photodetector is approximately constant independent to changes in the sensor's operating temperature.

In another embodiment, the interface circuit may include a sample hold circuit, which samples the residual charge on the integration capacitor at the end of a frame period after the last full LSB charge subtraction has occurred. In one embodiment, the held residual charge may be connected to a separate analog to digital converter (ADC) with a smaller charge equivalent LSB than the LSB set by the size of the charge subtraction capacitor and the change of voltage on the charge subtraction capacitor. In another embodiment, the additional ADC may be shared amongst a plurality of unit cells.

In one embodiment, the photodetectors may be an array of micro-bolometers. In another embodiment the photodetectors may be an array of photoconductors.

BRIEF DESCRIPTION OF THE DRAWINGS

Aspects and advantages of the embodiments provided herein are described with reference to the following detailed description in conjunction with the accompanying drawings. Throughout the drawings, reference numbers may be re-used to indicate correspondence between referenced elements. The drawings are provided to illustrate example embodiments described herein and are not intended to limit the scope of the disclosure.

DETAILED DESCRIPTION OF ILLUSTRATIVE EMBODIMENTS

Figure 1A:
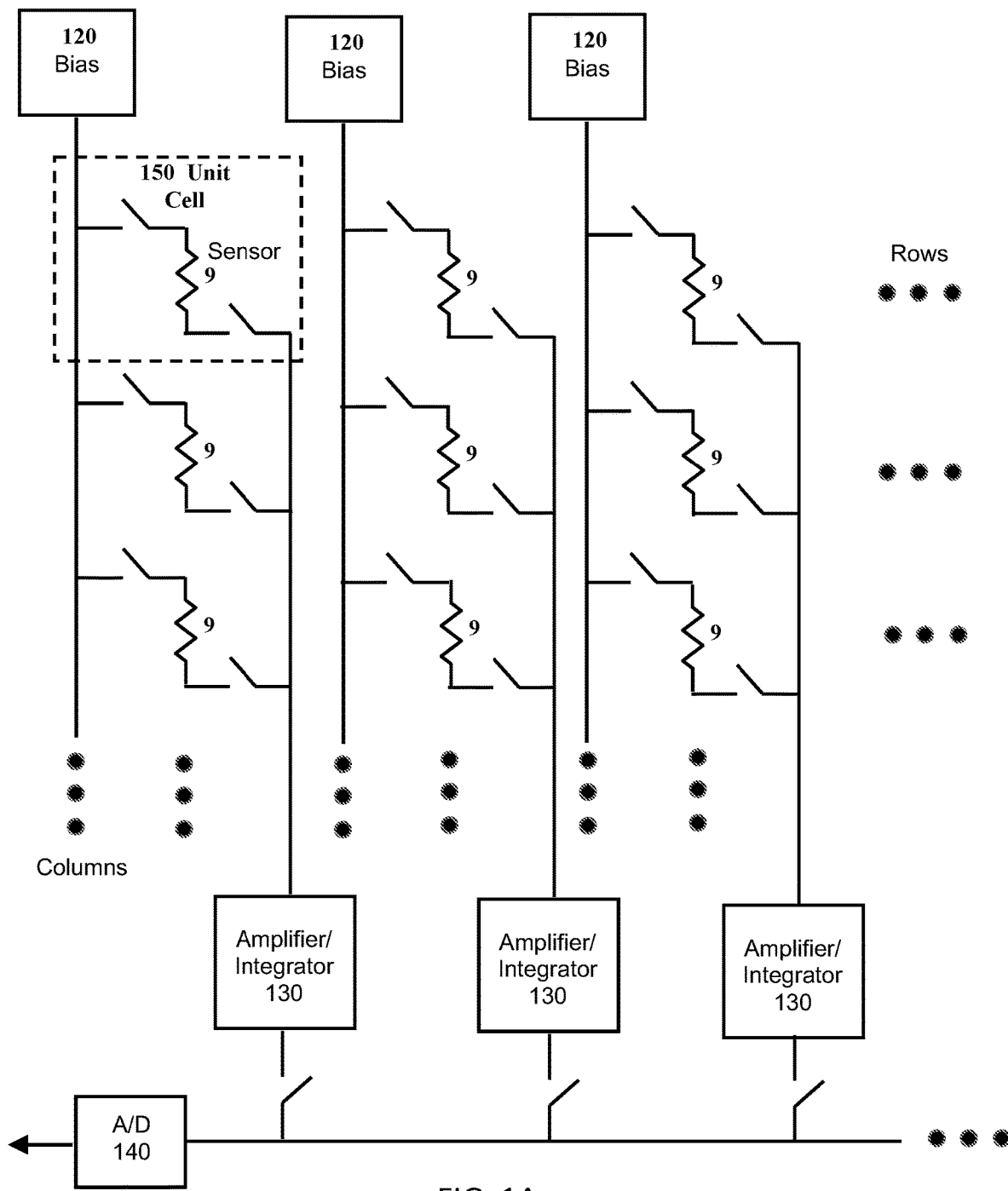
FIGS. 1A and 1B illustrate exemplary FPA detector and Read Out arrangements.

Generally, the embodiments described herein are directed to a portion of the Readout electronics associated with a photodetector. In many cases photodetectors are employed as imaging or tracking devices, and as such are often built into arrays of detectors. Common imaging arrays include CMOS technology based visible imaging arrays that are the heart of digital cameras. The current disclosure although applicable to common visible cameras is more directed to imaging arrays for applications such as low light, Infrared, Thermal, or other camera types whose design is more challenging than conventional visible imagers.

Most modern imagers include a microfabricated array of photodetectors, with the array a single die of a wafer, meaning the arrays are batch fabricated. The type of photodetector depends on the imaging application and a wide variety of detector types exist. Simple visible imagers may use an array of silicon photodiodes. Short and medium wave IR photodetectors may be based on non-standard semiconductors, such as PbS, quantum dots or HgCdTe photodiodes or photoconductors. Longwave Thermal photodetectors may be microbolometers, which are MEMS devices derived from silicon wafer fabrication. Other types of photodetectors exist as well, but other than for conventional visible cameras, the fabrication techniques for many photodetector arrays often require fabrication approaches beyond what is required for typical silicon wafer processing.

The arrays of photodetectors require interface electronics to convert the light dependent signal into useful data. For modern imaging arrays, the most common useful data is a digital stream of video data, where the magnitude of the digital information from each pixel is proportional to the intensity of the light incident on said pixel. Accordingly, the array of photodetectors needs to be interfaced to a suite of electronics that performs a series of functions. Referring to FIG. 1B, an example set of required elements to acquire and process signals from a sensor 9 is shown schematically. Photodetector, detector, and sensor will be used interchangeably in the current disclosure. Many light sensors, such as photodiodes or photoconductors, require a controlled bias voltage or current source 120 to operate. The change induced in the bias by light acting on the sensor needs to be buffered, amplified, and often integrated and sampled 130, and then converted to a digital value using an Analog-to-Digital converter (A/D) 140. Then the digital values from each photodetector must be organized and output, often as a digital data stream. The electronics to accomplish these typical tasks is often implemented as CMOS silicon integrated circuitry. i.e. mosfet transistors and suitable passive elements, although other circuit fabrication/material technologies are possible.

Modern imagers are typically made by mating an array of photodetectors with a circuit referred to as a Readout Integrated Circuit (ROIC) to produce a complete imaging chip often referred to as a Focal Plane Array (FPA). Each FPA is a hybrid of an array of photodetectors and a read out circuit, the readout, often but not necessarily, based on CMOS technology. Each ROIC is usually a die from a wafer. Depending on the type of detector, the corresponding photodetector arrays may be made on a separate wafer that is bonded to the ROIC wafer such that each sensor/ROIC die is permanently mechanically and electrically integrated, or the detectors may be fabricated on top of or a part of the ROIC wafer. For instance, when the wafer materials are different, such as an HgCdTe array mated with a silicon CMOS read out, two separately processed and then bonded together wafers (or die) are required. Some Microbolometer types can be fabricated on top of the ROIC wafer, so the entire FPA is made from one wafer (although sometimes a second, very simple, wafer is used as a vacuum cap). At any rate, the processing of both photodetector array and ROIC are usually performed at the wafer scale, and the resulting FPA's are single combined die from the wafer(s).

The readout circuit accesses each photodetector and converts the array of photodetector signals to a video data stream. Each portion of the stream, corresponding to all or part of the array captured within a given time, constitutes a "frame of data", and the number of frames output per unit time is the frame rate of the video stream. Not all FPA's for all applications take the data all the way to video, leaving some of the processing to be done off chip. Some more advanced FPA designs do more, such as image processing operations on chip, but wherever the functions reside, the basic interface elements shown in FIG. 1B usually exist somewhere in the imaging system.

Given the above, a key aspect of FPA design entails the arrangement of the interface elements, and in particular how to allocate the elements in terms of which elements are dedicated to each photodetector, and which elements are shared, i.e. switched between each photodetector in some time sliced manner. The size of each sensor, or pixel, in the array is related to the wavelength of the light the sensor is intended to detect and the complexity of the required interface circuitry. For visible imaging, pixels can be no smaller than a few hundred nanometers on a side. Pixel dimension range up to thermal imaging pixels which may be on the order of 10 microns or more in size. Even though visible imagers can be made entirely using state of the art silicon processing, ROIC designs carry the unique constraint that all circuitry required to interface with the pixel must be confined within the pixel footprint. And even thermal imaging pixels, given they are normally fabricated using at least somewhat non-standard, larger geometry processing techniques, don't provide a lot of room for circuit elements. Accordingly, the number of circuit elements that can fit under a single sensor, i.e. the dedicated interface elements, can be constrained by the pixel size. The portion of the ROIC directly under, and dedicated to, a single pixel is often referred to as the "unit cell." If not all of the interface elements can be put into the unit cell, the unit cell signals must be physically brought to the elements outside the boundary of the imaging area. It would be cumbersome electrically, and makes for a very large FPA chip, if dedicated elements existed for each sensor, so a typical approach is to "share" circuit elements by way of sequential switching of each sensor to shared elements. This common arrangement is illustrated schematically in FIGS. 1A and 1B, referred to as a "Pulse Bias" FPA because each sensor experiences a turn on condition, i.e. bias applied for only a part of a frame time with the vast majority of the circuitry shared between multiple pixels.

Figure 1B:
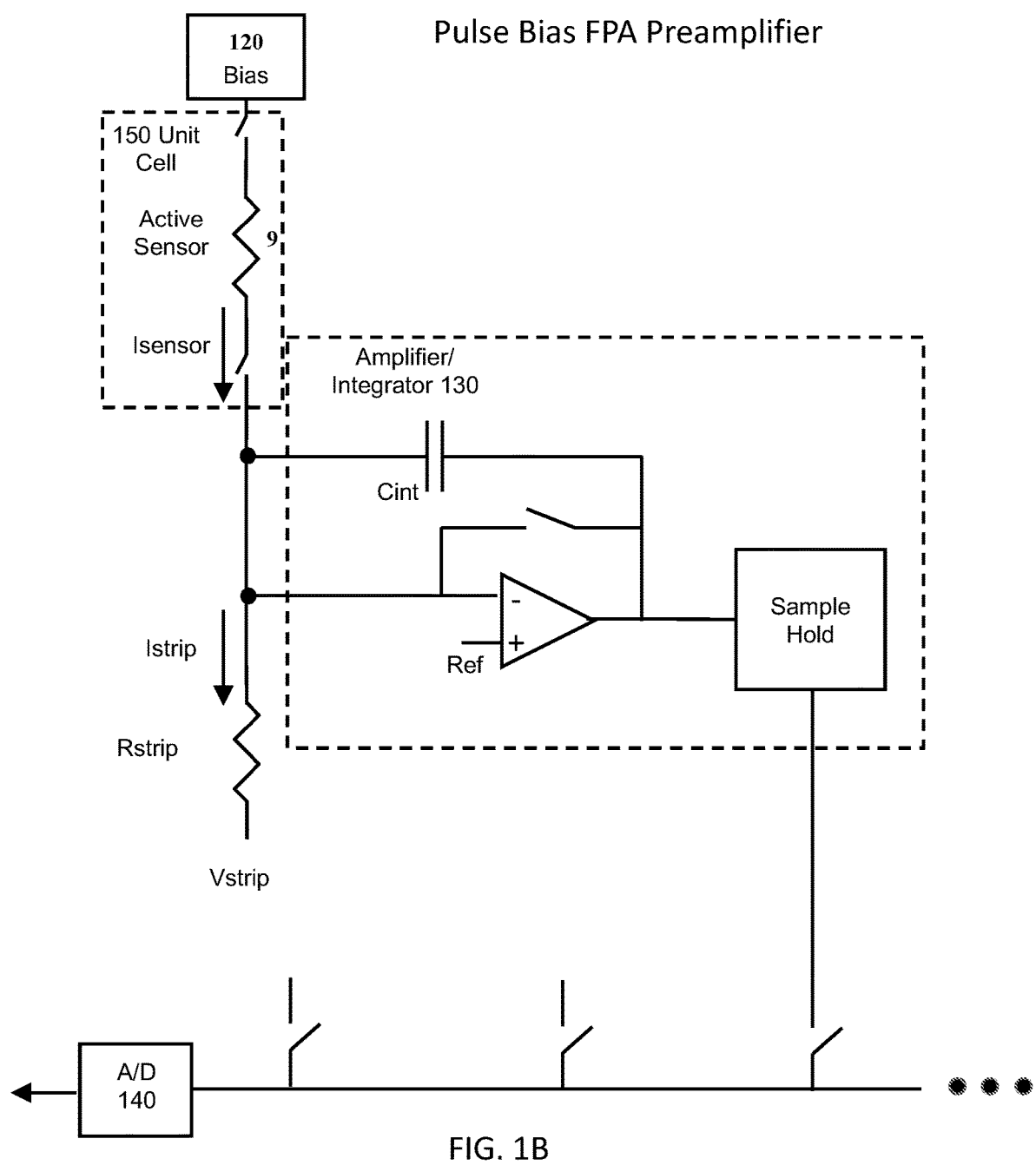

FIG. 1A shows part of an array of sensors 9. Imaging arrays are often arranged in columns and rows. To improve compatibility with display formats, standardized sizes and frame rates exist. For instance, the VGA standard is 640 rows by 480 columns with a frame rate of 60 Hz. HDTV is 1080×720 at 60 Hz. Non-standard imaging applications are more apt to benefit from the teachings of the current disclosure, but the standard formats provide examples of the timing which underlies some of the motivation leading to the current disclosure.

In FIGS. 1A and 1B, unit cell 150 is shown by example as containing relatively few dedicated elements, just switches that allow sequential connection of each sensor 9 to bias elements 120 and Amplifier/Integrator elements 130. The example shown in FIG. 1A shows each column of sensors sharing all or part of the bias 120 and amplifier 130 elements, with one A/D per FPA 140. The timing is controlled by a large number of switches, often implemented as mosfet switches, and clocking signals, not shown, controlling the timing, both internal and readout video stream timing. The example in FIG. 1A is very light on unit cell 150 components. In terms of the trade-off between unit cell dedicated elements and shared resources shared between unit cells, many variations are possible, other than that shown. However any sharing of on FPA chip resources has consequences on imaging parameters. What is important to note is that if resources are shared, then a lot of switching on and off of photodetectors needs to happen within each frame time, limiting the time each photodetector is active, and for a given frame rate this time shrinks as the number of the pixels in the FPA increases. With reduced active time comes increased electrical bandwidth and in analog circuitry a corresponding increase in noise and a reduction in signal to noise ratio.

In visible imaging, image contrast in a scene, expressed as the ratio of the brightest to darkest region can be 100%, however with thermal imaging the entire scene "glows" at a more or less uniform level, with the image being small (<10%) variations in this glow. Due to the inherent small signals present, maximizing the signal to noise (SNR) of the detected signal is of the upmost importance.

Sensors that operate directly at thermal wavelengths, such as microbolometers, are less sensitive to temperature changes in the bolometer induced by incident thermal radiation than they are to changes in their own ambient temperature, due to the fact that the transfer function between the temperature of a point in the image and the microbolometer's own temperature <<1. This means that the ROIC circuitry must be exceptionally low noise to achieve high SNR and must reject the large signal induced by changes in the sensor's ambient temperature.

Shared resource, or pulse bias type FPA's have drawbacks for more sensitive sensors. The short exposure times for individual detectors increase the ROIC's noise bandwidth, reducing SNR, with the bandwidth increasing with increased spatial resolution (number of pixels). This is addressed in microbolometer sensors by driving the bolometer harder. i/e. at higher bias currents, to increase it's response, which comes at the cost of reduced scene thermal dynamic range and increased non-linearity. Additionally, artifacts in the captured image can develop due to portions of the scene being captured at different times.

However, advances in circuit density, both due to decreasing linewidths in integrated circuit fabrication, and more advanced topologies such as multi-layer fabrication, make increasing the complexity of dedicated unit cell circuitry possible. More complex unit cell designs may be desirable for some applications even if they come with increased design time/cost.

Figure 2:
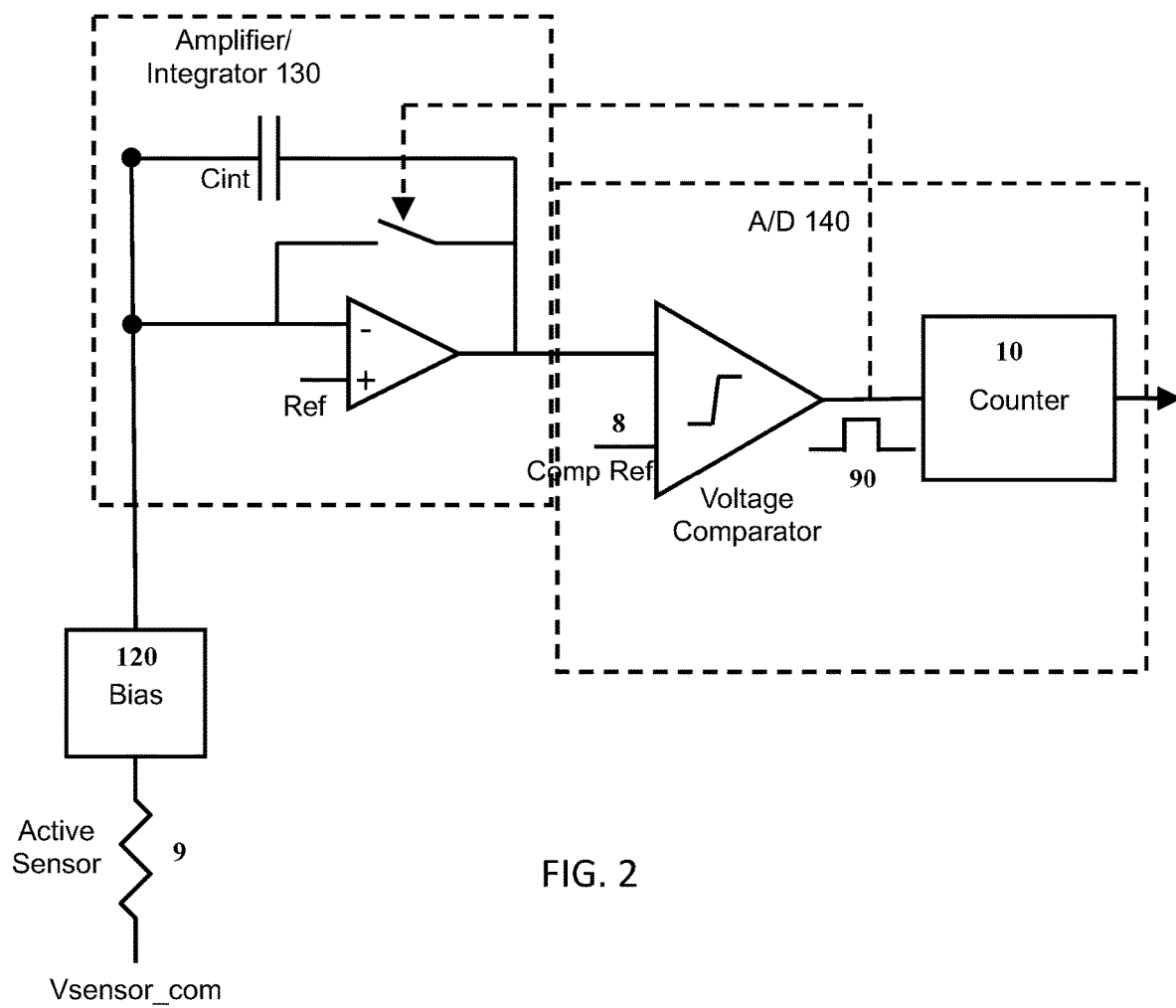
FIG. 2 illustrates an alternative digital pixel readout arrangement.

FIG. 2 shows an example "digital pixel" design for a unit cell, where all of the interface elements, Bias 120, Amplifier/Integrator 130, and A/D 140 needed to acquire and convert the sensor 9 signal to a digital value are present in every unit cell. Examples of the type of circuits that may be present in the elements are shown, and it should be noted that the functional blocks shown, amplifiers and digital circuits, actually consist of multiple transistors, so compared to a shared resource FPA, there are significantly more components in the example digital pixel unit cell than in a shared resource FPA design. However, the output of the unit cell is a digital value that can be held indefinitely, such as in a shift register or memory. Accordingly, a unit cell design of the type shown allows for each array sensor to acquire (integrate) signal for up to a full frame time and pass the digital data on for readout at the end of the integration time. And this is true regardless of the pixel count of the array. Thus, the signal detection of even low sensitivity detectors such as uncooled bolometers can approach cooled detector performance without the need for elaborate cryogenic coolers and do so even for very large pixel count arrays. Such capability is highly desirable to simplify the design of sensors that can detect low intensity signals with high spatial resolution, such as required for commercial and military sensors as well as other applications. It may be desirable for the comparator to force a momentary reset of the integrator when it trips as indicated by the dashed arrow connection in the Figure. In this disclosure an alternative to resetting the integrator will be described. implementation has one significant difference—instead of resetting the integrator a packet of charge is subtracted from the integrator, allowing the integrator to continue integrating. The Noise Equivalent Bandwidth (NEB) of the integrator is 1/(2×Tint), if the integrator is reset every count the NEB would be very large, increasing the noise from the detector and amplifier.

Many types of photoconductors require the application of a bias voltage or current to operate. In response to environmental stimulus, e.g. incident radiation on the sensor, the sensor modulates the voltage appearing across the sensor in the case of a current bias, or the current flowing in the sensor in the case of a voltage bias. Sensing elements such as bolometers or photoconductors differ from photovoltaic devices in that they require a significant level of bias current to operate, with the response of the device being a function of the magnitude of the bias current. This bias current can be orders of magnitude larger than the phenomena being sensed. As described above, earlier designs operated the array in a pulsed bias mode, where a given row of sensing elements was briefly biased up and read out by circuitry on the array periphery. Due to the short period of time the sensing elements were biased, a high bias current was used, and the noise equivalent bandwidth of the interface circuit was increased due to the short bias time, degrading the sensor signal to noise ratio. Bias current was managed by stripping off a fraction of the current flowing through the sensing element and greatly amplifying the remaining current, however stripping off a fixed current increases the effect of nonuniformity in the resistance of the sensing element, requiring complex per-pixel resistance non-uniformity correction schemes. In pulse bias microbolometer sensors, a resistor (Rstrip in FIG. 1B) is often used for this purpose. While effective, a resistive bias carries the drawback that it requires a significant amount of real estate to implement in an integrated circuit. Large resistors are doable in circuits employing pulse bias, where only some sensors (a row, single sensor, or some other subset of the whole array) are active (and biased) at a given point in time due to a single resistor being shared between multiple photodetectors. For such FPA's, the circuitry under each pixel can be as little as a few simple switches, leaving most of the area under the array available for resistors, which are often implemented as a resistive digital to analog converter, which is programmed on the fly as different photodetectors are selected.

In this disclosure the sensing element is operated under continuous bias, reducing the sensors noise equivalent bandwidth to a minimum value. Due to the entire current through the sensing element being digitized, the need for up front non-uniformity correction is eliminated. Such a "Digital" pixel architectures, as described above, place a significant amount of active circuitry under each pixel. They also support more sensitive sensor types, such as higher resistance bolometers (whose current can be limited by the voltage rating of the ROIC's CMOS circuitry).

Figure 3:
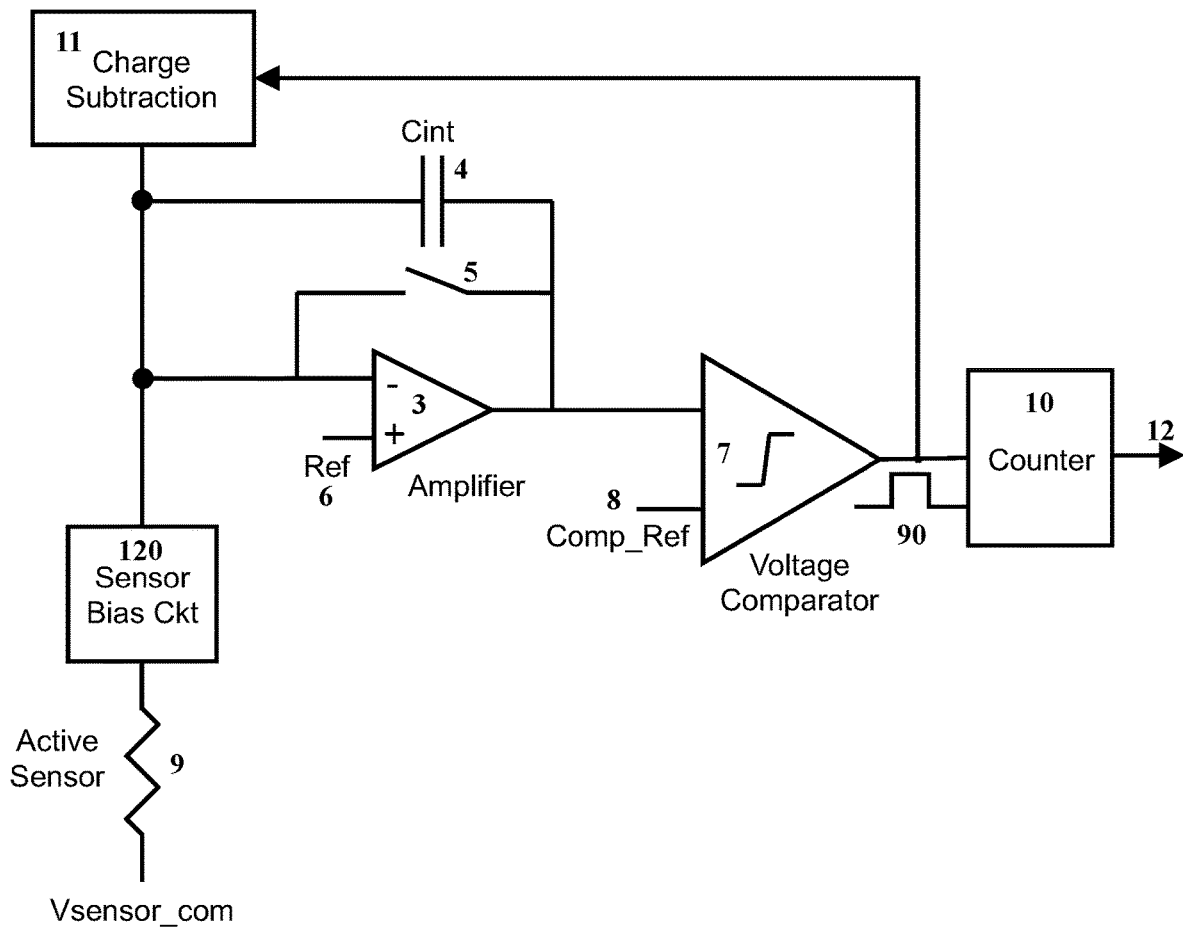
FIG. 3 illustrates an overview example embodiment of the novel interface circuit.

A novel technique used to implement a "Digital Pixel" readout integrated interface circuit for a sensing application, such as an infrared focal plane array is shown in FIG. 3. In FIG. 3, a sensing element (photodetector) 9 depicted here as a resistor has bias voltage supplied by 120 a sensor bias circuit. The bias current is source by current supplied by an integrator composed of a transimpedance amplifier, including amplifier 3 and feedback capacitor Cint 4. The integrator's output is reset to voltage Vref 6 at the beginning of a sample period by reset switch 5. The output voltage from the integrator is sensed by voltage comparator 7, whose output transitions high 90 when the integrator's output voltage crosses Comp_Ref 8. The output transition initiates a charge subtraction action 11 which removes a quantity of charge from Cint 4 and it increments a counter 10. The packet of charge subtracted can represent a charge representative of the least significant bit of this digitization, as is determined by the value chosen for Comp Ref 8 and the other characteristics of the circuit. The total count 12 is determined by a total amount of subtracted charge representative of the current flowing in the sensing element, and thus is a digital representation of the photodetector 9 signal.

Figure 4:
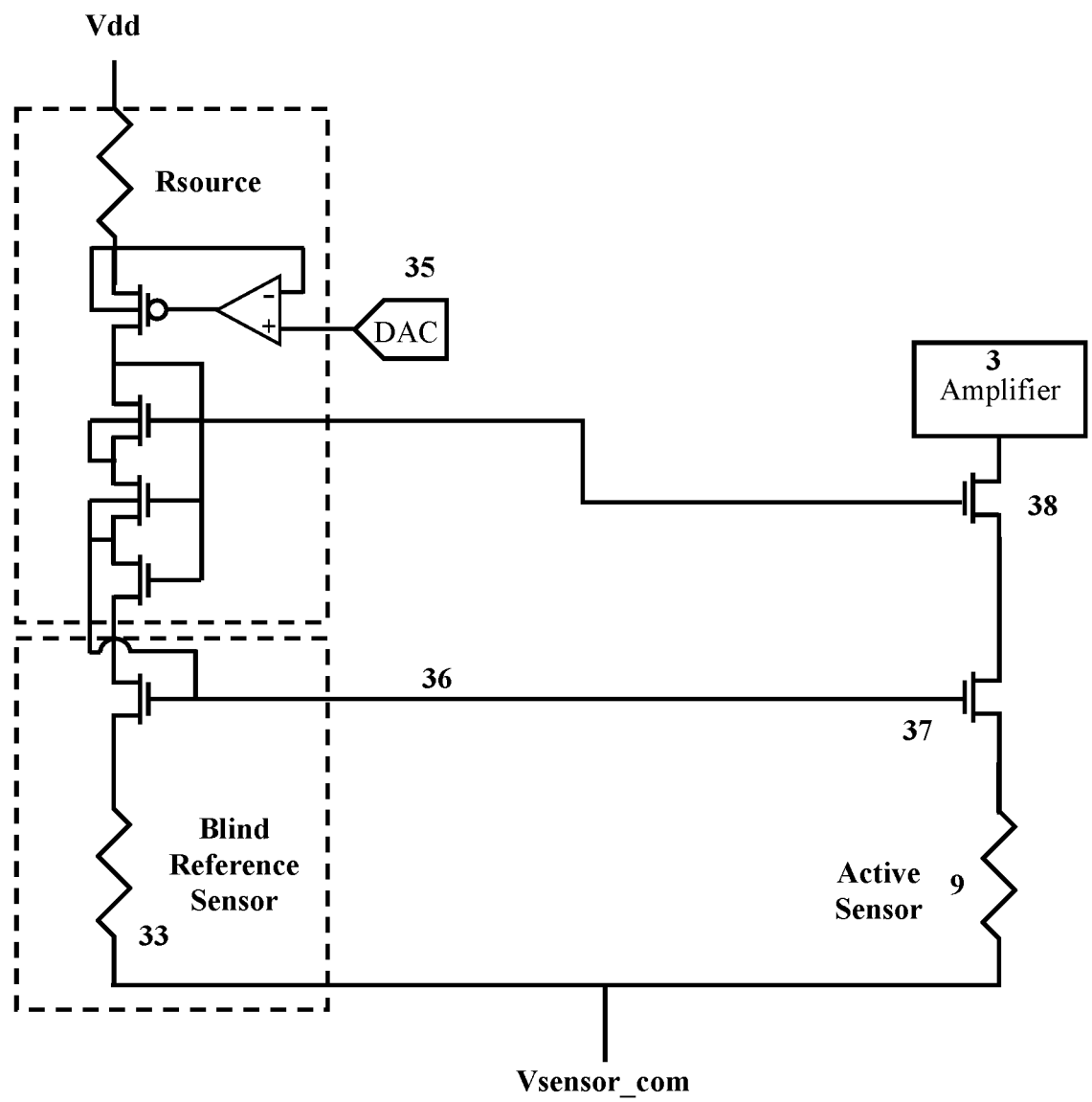
FIG. 4 illustrates an exemplary bias circuit with reference detector.

FIG. 4 depicts an exemplary sensor element bias control circuit suitable for the current disclosed interface circuits. A digital to analog converter (DAC) 35 is programmed to set a voltage at the lower end of Rsource, with the resulting current being (Vdd−V_DAC)/Rsource. This current is furnished to establish a resulting operating voltage 36 across one or more optically blinded reference sensing elements 33. This operating voltage 36 tracks changes in the sensors operating temperature, and automatically adjusts to maintain a constant current in the reference sensor element. Voltage 36 is applied to the gate of a MOSFET 37 operating as a current mirror to induce a current corresponding to source current in the active sensing element (e.g. photodetector) 9. Changes in the photodetector 9 resistance (such as those induced by incident optical energy) will modulate the current flowing in 37. This current passes through cascode MOSFET 38 where it is sourced by the capacitive transimpedance amplifier 3 described in FIG. 3.

Figure 5:
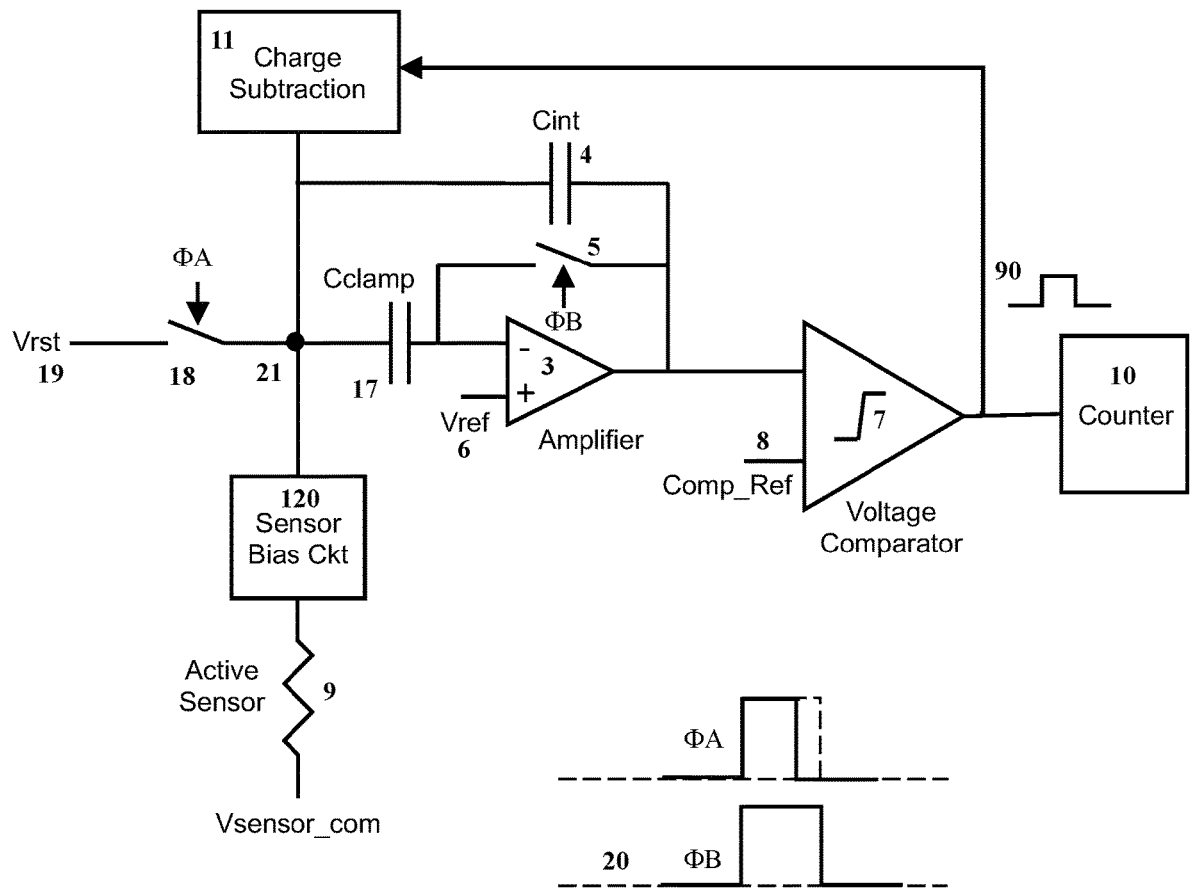
FIG. 5 illustrates an exemplary embodiment of a circuit element to increase the photodetector bias voltage.

FIG. 5 depicts a circuit to increase the voltage available to the active sensing element 9. The capacitive transimpedance amplifier shown in FIG. 3 is reset to the lower end of the circuit's operating voltage range, which allows the amplifier output to slew positive to cause the integration capacitor 4 to bias the active sensing element. As a result, the voltage across the active sensor 9 is limited to Vref−Vsensor_com, which may be inadequate for some applications, especially with very high resistance sensor elements. FIG. 5 depicts the inclusion of a clamp capacitor Cclamp 17 in series with the inverting (negative) input of amplifier 3 and the summing node connecting one end of capacitor 4 and bias circuit 120. A reset switch 18 is activated by pattern ΦA while the integrator 3 reset switch 5 is activated by pattern ΦB, causing capacitor 17 to be charged to a voltage Vrst 19−Vref 6. When patterns ΦA and ΦB are de-asserted, summing node 21 remains at Vrst 19, held there by current sourced through Cint 4. Through this sequence, the operating voltage on 21 is much higher than Vref, which means a higher voltage is available the active sensor 9. ΦA and ΦB need to be high for an overlapping period but ΦA can go low before ΦB and the functionality will be maintained.

Figure 6:
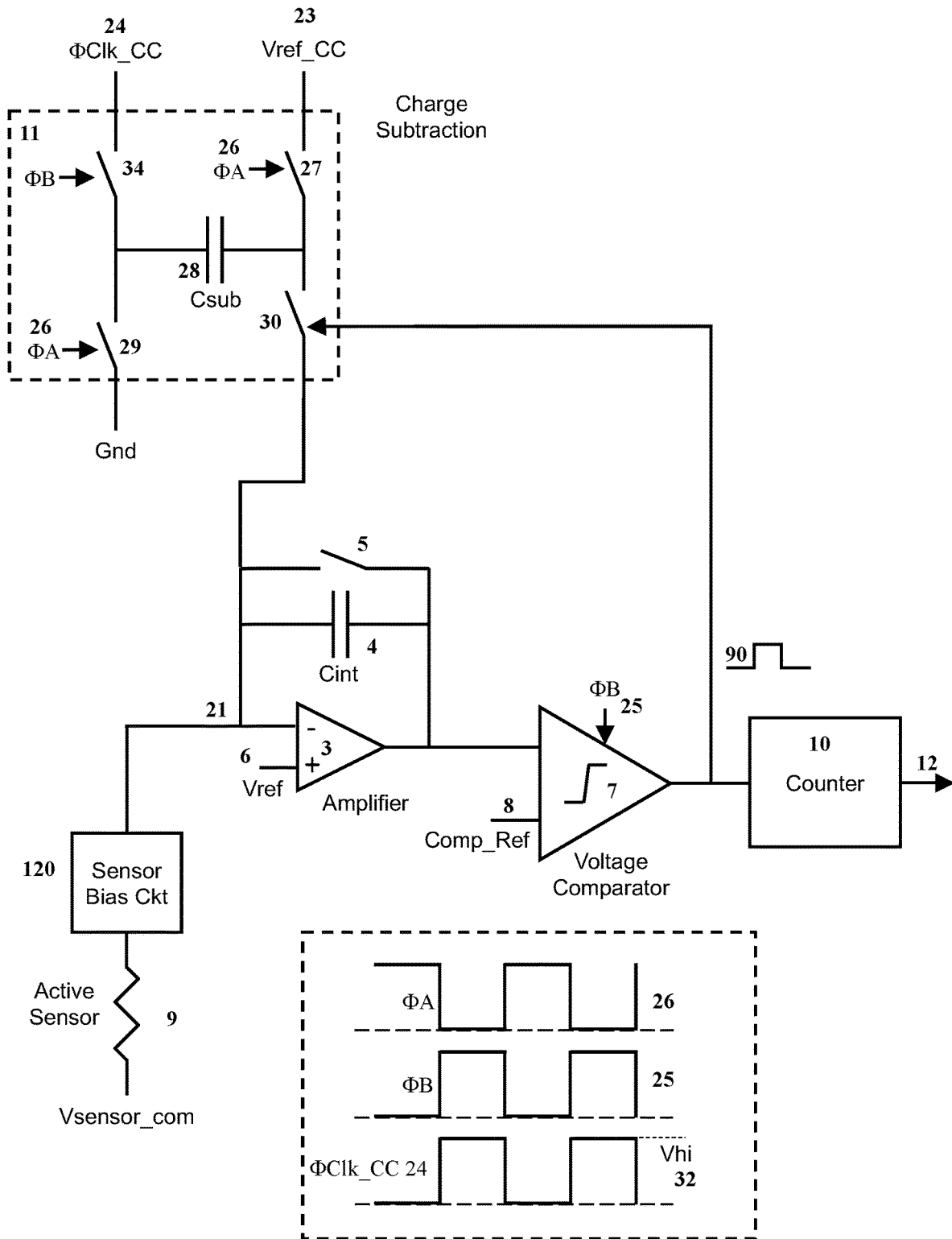
FIG. 6 illustrates an exemplary embodiment of a circuit element to perform charge subtraction.

FIG. 6 depicts a specific example circuit 11 to remove the quantity of charge from Cint 4 described in FIG. 3. In FIG. 6, a sensing element 9 depicted as a resistor has it's operating voltage supplied by 120 a sensor bias circuit. The bias current is sourced by current supplied by an integrator composed of amplifier 3 and feedback capacitor Cint 4. The integrator's output is reset to voltage Vref 6 at the beginning of a sample period by reset switch 5. The output voltage from the integrator is sensed by voltage comparator 7, whose output transitions high 90 when the integrator's output voltage crosses Comp_Ref 8. The voltage comparator is active when clocked by ΦB 25, which is one of a pair of complementary clocks ΦB 25 and ΦA 26. Capacitor Csub 28 is charged when switches 27 and 29 are activated by clock 26 ΦA going high, which charges Csub 28 to Vref_CC 23. When ΦB transitions to a high state it closes switch 34, which couples clock ΦClk_CC 24 to one side of capacitor Csub 28. If the integrator's 3 output level is less than Comp_Ref 8 the comparator is not triggered, comparator output 9 does not transition high and switch 30 remains open and there is no change to the charge stored on Cint 4. When ΦB transitions to a high state it closes switch 26, which couples clock ΦClk_CC 24 to one side of capacitor Csub 28. If the integrator's 3 output level is greater than Comp_Ref 8 the comparator 7 is triggered, comparator output 90 transitions high and switch 30 closes, resulting in ΦClk_CC pushing the charge stored on Csub 18 onto the integrators summing node 21. The integrator's 3 output slews downward to maintain the summing node 21 at Vref 6 resulting in the removal of charge from Cint 4. The magnitude of the charge removed is the product of Csub 18×high level of (ΦClk_CC 24+Vref_CC 23−Vref 6). By clocking the formerly low side of Csub 18 the circuit is able to transfer charge onto the summing node 21 while this node is at a voltage near the CMOS process high voltage limit. The rate at which clocks 26 cycle must be greater than the maximum current in the active sensor 9/(Cint 4×the maximum amplifier 3 output voltage swing×frame rate). The packet of charge subtracted represents the least significant bit of this digital pixel, with the total count 12 representing the current flowing in the sensing element. There is a noise term associated with this charge subtraction process, it can be expressed as $$Inoise = \sqrt{\frac{k \times T_{ROIC} \times Isensor}{Frame_{Rate} \times \Delta V \text{ on } Csub}}$$

by first resetting Csub between ground and Vref_CC, then pulsing the formerly grounded end of Csub to ΦClk_CC a higher effective ΔV on Csub can be achieved, which reduces the noise generated by the charge subtraction process.

Figure 7:
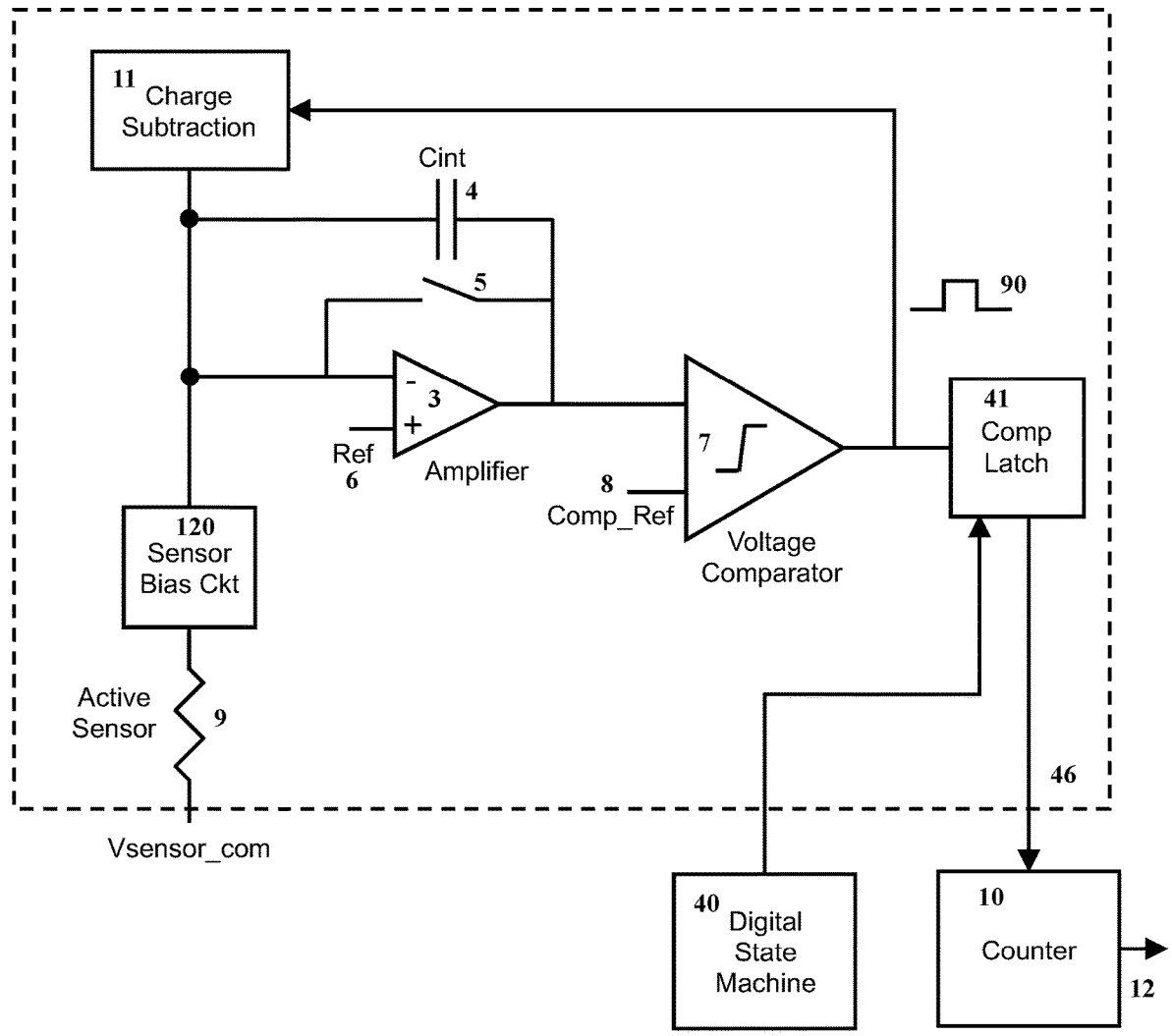
FIG. 7 illustrates an alternative embodiment of counter arrangement.

One limitation of this architecture is the area required for the counter, which becomes problematic to fit in the available pixel area as pixel sizes shrink. FIG. 7 depicts one embodiment, which places the counter at the periphery of the ROIC, a case where not all of the interface circuit lies within the unit cell. In FIG. 7, a sensing element 9 depicted as a resistor has it's bias voltage supplied by 120 a sensor bias circuit. The bias current is sourced by current supplied by an integrator composed of amplifier 3 and feedback capacitor Cint 4. The integrator's output is reset to voltage Vref 6 at the beginning of a sample period by reset switch 5. The output voltage from the integrator is sensed by voltage comparator 7, whose output transitions high 90 when the integrator's output voltage crosses Comp_Ref 8. The output transition initiates a charge subtraction action 11 which removes a quantity of charge from Cint 4 and sets a latch, Comp Latch 41, which retains the information that the comparator's output had transitioned. A digital state machine 40 located outside of the pixel area 46 periodically polls the latch 41. If the latch is set the counter 10 is incremented and the latch is cleared. The packet of charge subtracted represents the least significant bit of this digital pixel, with the total count 12 representing the current flowing in the sensing element.

Figure 8:
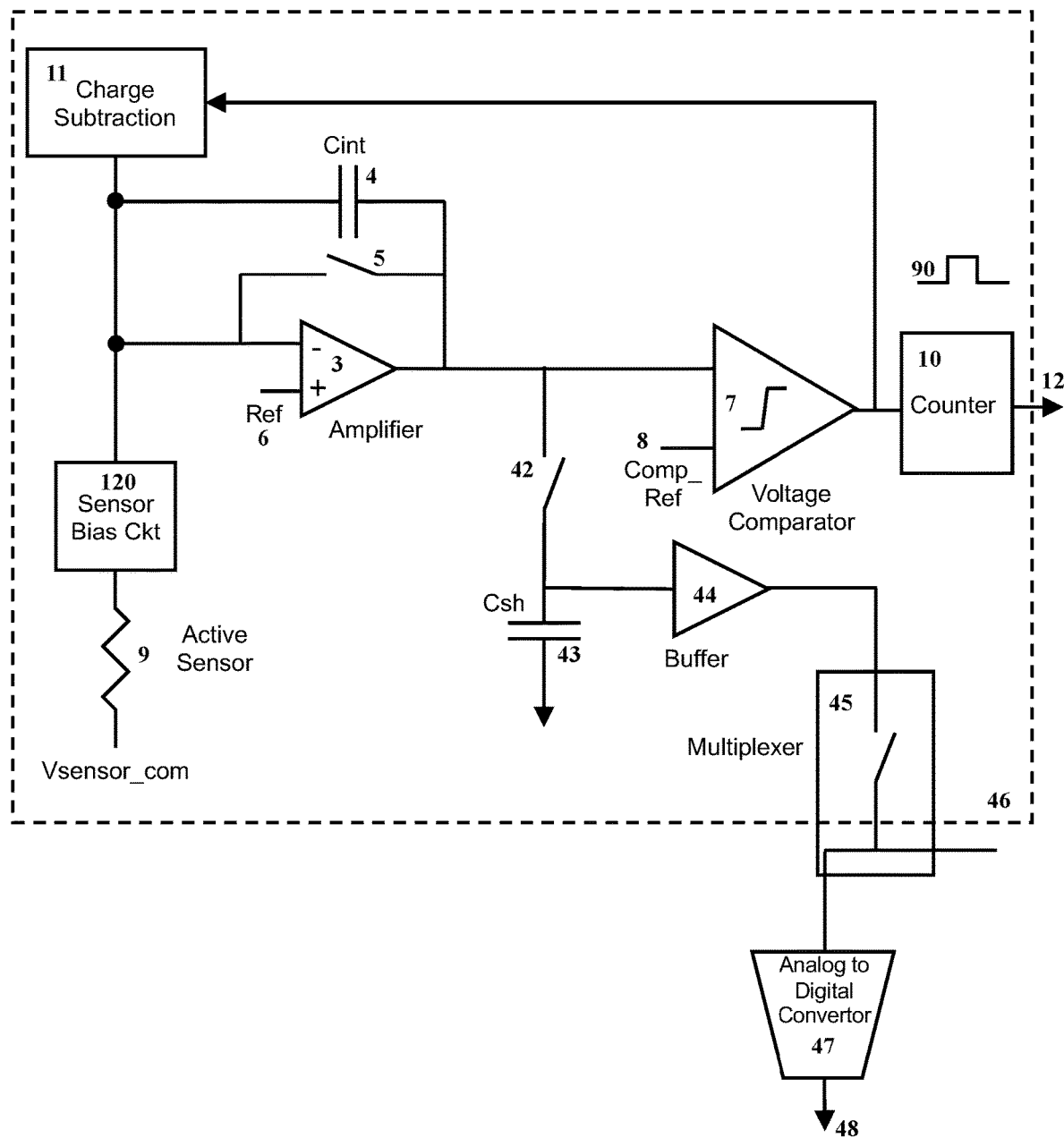
FIG. 8 illustrates an alternative embodiment of digitization arrangement.

Another limitation of this architecture is the size of the LSB resulting from the charge subtraction action described in FIG. 3. Quantization of a signal introduces noise, with an ideal quantizer's noise being defined as the LSB/sqrt (12). While the LSB can be made arbitrarily small by shrinking the size of the subtracted charge packet, this carries with it higher clock rates, increased power and elevated noise associated with the resetting of the charge subtraction circuit plus a higher resolution counter. FIG. 8 depicts an alternative approach, where the LSB represented by amount of charge removed per subtraction is chosen to be relatively large, and the residue charge present at the end of the sample period is retained and digitized at a higher resolution, thus increasing the resolution of the digitization and lowering the quantization noise. In FIG. 8, a sensing element 9 depicted as a resistor has it's bias voltage supplied by 120 a sensor bias circuit. The bias current is sourced by current supplied by an integrator composed of amplifier 3 and feedback capacitor Cint 4. The integrator's output is reset to voltage Vref 6 at the beginning of a sample period by reset switch 5. The output voltage from the integrator is sensed by voltage comparator 7, whose output transitions high 90 when the integrator's output voltage crosses Comp_Ref 8. The output transition initiates a charge subtraction action 11 which removes a quantity of charge from Cint 4 and it increments a counter 10. The packet of charge subtracted represents the least significant bit of this digital pixel, with the total count 12 representing the current flowing in the sensing element. At the end of the sample period, sample switch 42 closes momentarily, opening immediately before reset switch 5 closes, causing the voltage on Csh 43 to reflect the charge present on Cint 4 at the end of the sample period. The voltage on Csh 4 passes through a buffer 44 that isolates Csh 43 from capacitive loading by following switches 45, which direct the sample held on Csh 43 to a higher resolution Analog to Digital Converter (ADC) 47, In one embodiment, switching and subsequent operation include multiplexer 45, with the multiplexer 45 sequentially connecting the outputs from multiple pixels to an analog to digital converter (ADC) 47 which is located outside of the circuitry located within the confines of the pixel 46. The ADC 47 converts the voltage from buffer 44 into an equivalent digital value 48, which is combined with the output from the counter 12 as a digital representation of the current passing through the pixel during the sample period. Thus the digitization is partitioned between unit cell dedicated circuit elements and elements shared among multiple pixels.

Other approaches to addressing lack of space for interface circuit elements may include fabrication and design techniques that include vertical integration concepts. For instance, the counter may be implemented on a separate CMOS wafer stacked and interfaced vertically, where the counter wafer is CMOS optimized for digital circuitry and the other ROIC wafer is CMOS optimized for analog circuitry. Other possibilities include fabricating the counter using Carbon NanoTube (CNT) circuitry, integrated vertically above the active circuitry. Other alternative 3D circuit arrangements are possible as well.

Conditional language used herein, such as, among others, "can," "might," "may," "e.g.," and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments or that one or more embodiments necessarily include logic for deciding, with or without author input or prompting, whether these features, elements and/or states are included or are to be performed in any particular embodiment. The terms "comprising," "including," "having," "involving," and the like are synonymous and are used inclusively, in an open-ended fashion, and do not exclude additional elements, features, acts, operations, and so forth. Also, the term "or" is used in its inclusive sense (and not in its exclusive sense) so that when used, for example, to connect a list of elements, the term "or" means one, some, or all of the elements in the list.

Disjunctive language such as the phrase "at least one of X, Y or Z," unless specifically stated otherwise, is otherwise understood with the context as used in general to present that an item, term, etc., may be either X, Y or Z, or any combination thereof (e.g., X, Y and/or Z). Thus, such disjunctive language is not generally intended to, and should not, imply that certain embodiments require at least one of X, at least one of Y or at least one of Z to each be present The terms "about" or "approximate" and the like are synonymous and are used to indicate that the value modified by the term has an understood range associated with it, where the range can be ±20%, ±15%, ±10%, ±5%, or ±1%. The term "substantially" is used to indicate that a result (e.g., measurement value) is close to a targeted value, where close can mean, for example, the result is within 80% of the value, within 90% of the value, within 95% of the value, or within 99% of the value.

Unless otherwise explicitly stated, articles such as "a" or "an" should generally be interpreted to include one or more described items. Accordingly, phrases such as "a device configured to" are intended to include one or more recited devices. Such one or more recited devices can also be collectively configured to carry out the stated recitations. For example, "a processor configured to carry out recitations A, B and C" can include a first processor configured to carry out recitation A working in conjunction with a second processor configured to carry out recitations B and C.

While the above detailed description has shown, described, and pointed out novel features as applied to illustrative embodiments, it will be understood that various omissions, substitutions, and changes in the form and details of the elements illustrated can be made without departing from the spirit of the disclosure. As will be recognized, certain embodiments described herein can be embodied within a form that does not provide all of the features and benefits set forth herein, as some features can be used or practiced separately from others. All changes which come within the meaning and range of equivalency of the claims are to be embraced within their scope.

The invention claimed is:

1. An interface circuit for a photodetector providing digitization of the current flowing in the detector, comprising;
   a bias circuit connected to one terminal of the photodetector;
   a transimpedance amplifier having a capacitive feedback element as an integrator of the detector current, the feedback element connected between the amplifier output and a node connected to one of the sink or source current from the photodetector and the negative input of the amplifier, wherein the feedback element is periodically reset;
   a voltage comparator configured to compare the output of the transimpedance amplifier with a predetermined reference voltage;
   a charge subtraction circuit configured to remove a quantity of charge from the transimpedance amplifier's feedback element when triggered by the voltage comparator; and,
   a digital counter configured to count the number of charge subtraction events over a frame period.

2. The interface circuit of claim 1 wherein the photodetector is a bolometer.

3. The interface circuit of claim 1 wherein the photodetector is a photoconductor.

4. The interface circuit of claim 1 wherein the photodetector is part of an imaging array, each photodetector pixel in the array associated with a unit cell of a Read Out Integrated Circuit integrated with the array of photodetectors, and at least one or more elements of the interface circuit are part of a unit cell per pixel, and wherein the array of photodetectors and the ROIC are microfabricated using at least one CMOS silicon wafer.

5. The interface circuit of claim 1 wherein all of the interface circuit elements are fabricated within each unit cell.

6. The interface circuit of claim 1 wherein the counter is located outside the unit cell.

7. The interface circuit of claim 1 wherein the counter is fabricated on at least one second CMOS wafer, and integrated with the array and ROIC using 3-dimensional circuit integration techniques.

8. The interface circuit of claim 1 wherein the counter is fabricated utilizing carbon nanotube CMOS logic and is integrated above the ROIC's active circuitry.

9. The interface circuit of claim 1 further comprising a reference voltage applied to the positive terminal of the transimpedance integration amplifier.

10. The interface circuit of claim 1 further comprising a clamp capacitor connected between the node connected to one of the sink or source current from the photodetector and the amplifier's negative input.

11. The interface circuit of claim 10 further comprising a switch connecting the node to sink or source current from the photodetector to an independent voltage source, the switch activated while the feedback element is in reset, wherein the voltage on the node connected to sink or source current from the photodetector is set to a level independent of the amplifier's reset voltage.

12. The interface circuit of claim 1 wherein the charge subtraction is performed via a clocked capacitor, configured to subtract an amount of charge on the integration capacitor sufficient to return the integrator's output closer to it's reset level.

13. The interface circuit of claim 1 wherein the charge subtractions will occur until the total amount of charge subtracted corresponds roughly to the current flowing in the photodetector times the frame period, and the total count of comparator triggers is the digitization of the photodetector current.

14. The interface circuit of claim 1 wherein the bias circuit includes a differential arrangement with at least one blind reference detector whereby the current flowing in the photodetector is approximately constant independent to changes in the sensor's operating temperature.

15. The interface circuit of claim 1 comprising a sample hold circuit, which samples the residual charge on the integration capacitor at the end of a frame period after the last full LSB charge subtraction has occurred.

16. The interface circuit of claim 15 wherein the held residual charge is connected to a separate analog to digital converter (ADC) with a smaller charge equivalent LSB than the LSB set by the size of the charge subtraction capacitor and the change of voltage on the charge subtraction capacitor.

17. The interface circuit of claim 16 wherein the additional ADC is shared amongst a plurality of unit cells.

18. The interface circuit of claim 2 wherein the photodetectors are an array of micro-bolometers.

19. The interface circuit of claim 3 wherein the photodetectors are an array of photoconductors.

* * * * *